(12) United States Patent
Robinson et al.

(10) Patent No.: US 7,899,098 B2
(45) Date of Patent: Mar. 1, 2011

(54) MONITORING METHOD AND DEVICE FOR MONITORING A FORWARD VOLTAGE OF A LASER DIODE IN A LASER DIODE DRIVER INTEGRATED CIRCUIT (IC)

(75) Inventors: Michael A. Robinson, Fremont, CA (US); Laura Giovane, Sunnyvale, CA (US); An-Nien Cheng, San Jose, CA (US)

(73) Assignee: Avago Technologies Fiber IP (Singapore) Pte. Ltd., Singapore (SG)

( * ) Notice: Subject to any disclaimer, the term of this patent is extended or adjusted under 35 U.S.C. 154(b) by 164 days.

(21) Appl. No.: 12/277,625

(22) Filed: Nov. 25, 2008

(65) Prior Publication Data
US 2010/0128748 A1    May 27, 2010

(51) Int. Cl.
*H01S 3/00*    (2006.01)
(52) U.S. Cl. ............... 372/38.02; 372/38.1; 372/38.01; 372/38.05; 372/38.07

(58) Field of Classification Search ............... 372/38.1, 372/38.01, 38.02, 38.05, 38.07
See application file for complete search history.

(56) References Cited

U.S. PATENT DOCUMENTS

| | | | |
|---|---|---|---|
| 6,909,731 B2 * | 6/2005 | Lu | 372/29.01 |
| 7,180,921 B2 * | 2/2007 | Mangano et al. | 372/38.02 |
| 7,593,645 B2 * | 9/2009 | Sicard et al. | 398/182 |
| 2004/0165629 A1 * | 8/2004 | Iwakura | 372/38.02 |
| 2004/0202216 A1 * | 10/2004 | Fairgrieve | 372/38.07 |
| 2005/0041707 A1 * | 2/2005 | Mangano et al. | 372/38.02 |

* cited by examiner

*Primary Examiner*—Minsun Harvey
*Assistant Examiner*—Yuanda Zhang (57) ABSTRACT

A laser diode driver IC of a transmitter or transceiver is provided with circuitry for monitoring the forward voltage of the laser diode or laser diodes of the transmitter or transceiver to enable the health of the laser diode or diodes to be assessed in real-time.

24 Claims, 5 Drawing Sheets

MONITORING METHOD AND DEVICE FOR MONITORING A FORWARD VOLTAGE OF A LASER DIODE IN A LASER DIODE DRIVER INTEGRATED CIRCUIT (IC)

TECHNICAL FIELD OF THE INVENTION

The invention relates to optical communications systems. More particularly, the invention relates to monitoring the forward voltage of a laser diode in a laser diode driver integrated circuit (IC) to determine the health of the laser diode.

BACKGROUND OF THE INVENTION

Optical transmitters and optical transceivers used in optical communications typically use laser diodes to generate optical signals that represent data, which are then transmitted over optical fibers. The laser diodes are typically integrated into laser diode ICs. In single-channel transmitters and transceivers, the laser diode IC typically contains a single laser diode. In multi-channel transmitters and transceivers, often referred to as parallel transmitters and parallel transceivers, the laser diode IC typically includes the same number of laser diodes as there are transmit channels in the transmitter or transceiver. The laser diodes are driven by laser diode driver circuitry. The laser diode driver circuitry is typically contained in a laser diode driver IC that is separate from the laser diode IC. The laser diode driver IC produces the electrical signals that drive the laser diode or diodes.

The laser diode IC, the laser diode driver IC and a controller IC are typically mounted on a circuit board of the transmitter or transceiver module. Typically, a monitor photodiode IC is also mounted on the circuit board. Other components may also be mounted on the circuit board, such as, for example, an analog-to-digital converter (ADC) and a digital-to-analog converter (DAC). Conductive output pads of the laser diode driver IC are wire bonded to conductive input pads of the laser diode IC. Conductive input pads of the laser diode driver IC are wire bonded to conductive output pads of the controller IC. Conductive output pads of the monitor photodiode IC are wire bonded to conductive input pads of the controller IC. The monitor photodiode IC includes one or more monitor photodiodes that monitor the light output power (LOP) level of one or more respective laser diodes of the laser diode IC. The monitor photodiodes output electrical signals related to the amount of light impinging thereon. These electrical signals are typically analog signals, which are converted into digital signals by an ADC and then fed back to the controller IC. The controller IC processes these digital signals and produces output signals that are output from the controller IC to the laser diode driver IC. These signals adjust the bias and/or modulation currents of the laser diode driver circuits such that the electrical drive signals that are output from the laser diode driver IC to the laser diode IC ensure that the laser diodes output the proper LOP levels for representing a logic 0 level and a logic 1 level and are biased at an operating condition that allows the laser diodes to have optical characteristics, such as rise-time and fall-time, that are appropriate for the particular application.

Degradation of the LOP level provides information about the health of the laser diode. For example, if a drop in the LOP level occurs that is not caused by a change in the bias or modulation currents of the laser diode, this may be an indication that the laser diode has failed or that failure of the laser diode is likely to occur soon. However, information in addition to, or in lieu of, LOP level information is needed to accurately determine the health of the laser diode.

SUMMARY OF THE INVENTION

The invention is directed to a method and apparatus for monitoring the forward voltage of one or more laser diodes of an optical transmitter to enable the health of the laser diode or diodes to be assessed in real-time. The optical transmitter comprises N laser diodes and a laser diode driver IC, wherein N is a positive integer that is equal to or greater than 1, and a laser diode driver IC. Each laser diode is configured to receive an electrical drive signal that causes the laser diode to produce an optical signal having a light output power (LOP) level. Each laser diode has a cathode and an anode, and a respective forward voltage ($V_{FWD}$) signal passes between the anode and the cathode of each respective laser diode. The laser diode driver IC comprises N laser diode driver circuits, each of which generates an electrical drive signal that is output via one or more electrical contact pads of the driver IC to a respective one of the laser diodes to cause the respective laser diode to produce a respective optical signal having a respective LOP level. At least one $V_{FWD}$ monitoring circuit is configured to acquire and measure the $V_{FWD}$ signal passing between the anode and cathode of at least one of the N laser diodes. The $V_{FWD}$ monitoring circuit outputs a $V_{FWD}$ output signal indicative of the measured $V_{FWD}$ signal. The laser diode driver controller has logic configured to control the laser diode driver IC.

The method comprises providing N laser diodes in the transmitter, providing a laser diode driver IC comprising N laser diode driver circuits, at least one $V_{FWD}$ monitoring circuit, and a laser diode driver controller, causing each driver circuit to generate an electrical drive signal that is output via one or more electrical contact pads of the driver IC to a respective one of the laser diodes to cause the respective laser diode to produce a respective optical signal having a respective LOP level, with a $V_{FWD}$ monitoring circuit, acquiring and measuring the $V_{FWD}$ signal passing between the anode and cathode of at least one of the N laser diodes, and outputting a $V_{FWD}$ output signal from the $V_{FWD}$ monitoring circuit indicative of the measured $V_{FWD}$ level.

These and other features and advantages of the invention will become apparent from the following description, drawings and claims.

DETAILED DESCRIPTION OF AN ILLUSTRATIVE EMBODIMENT

It is known to measure the forward voltage level of a laser diode during manufacturing of the laser diode IC as part of a product screening process that determines whether the laser diode operates properly. However, there is currently no known method or mechanism for monitoring the forward voltage of the laser diode after the laser diode IC has been integrated into a transmitter or transceiver module and shipped to a customer. In accordance with the invention, a laser diode driver IC of a transmitter or transceiver module is provided with circuitry for monitoring the forward voltage of the laser diode or diodes to enable the health of the laser diode or diodes to be assessed in real-time. The forward voltage monitoring circuitry may be implemented in a variety of ways, a few of which will now be described with reference to a few illustrative embodiments.

Figure 1:
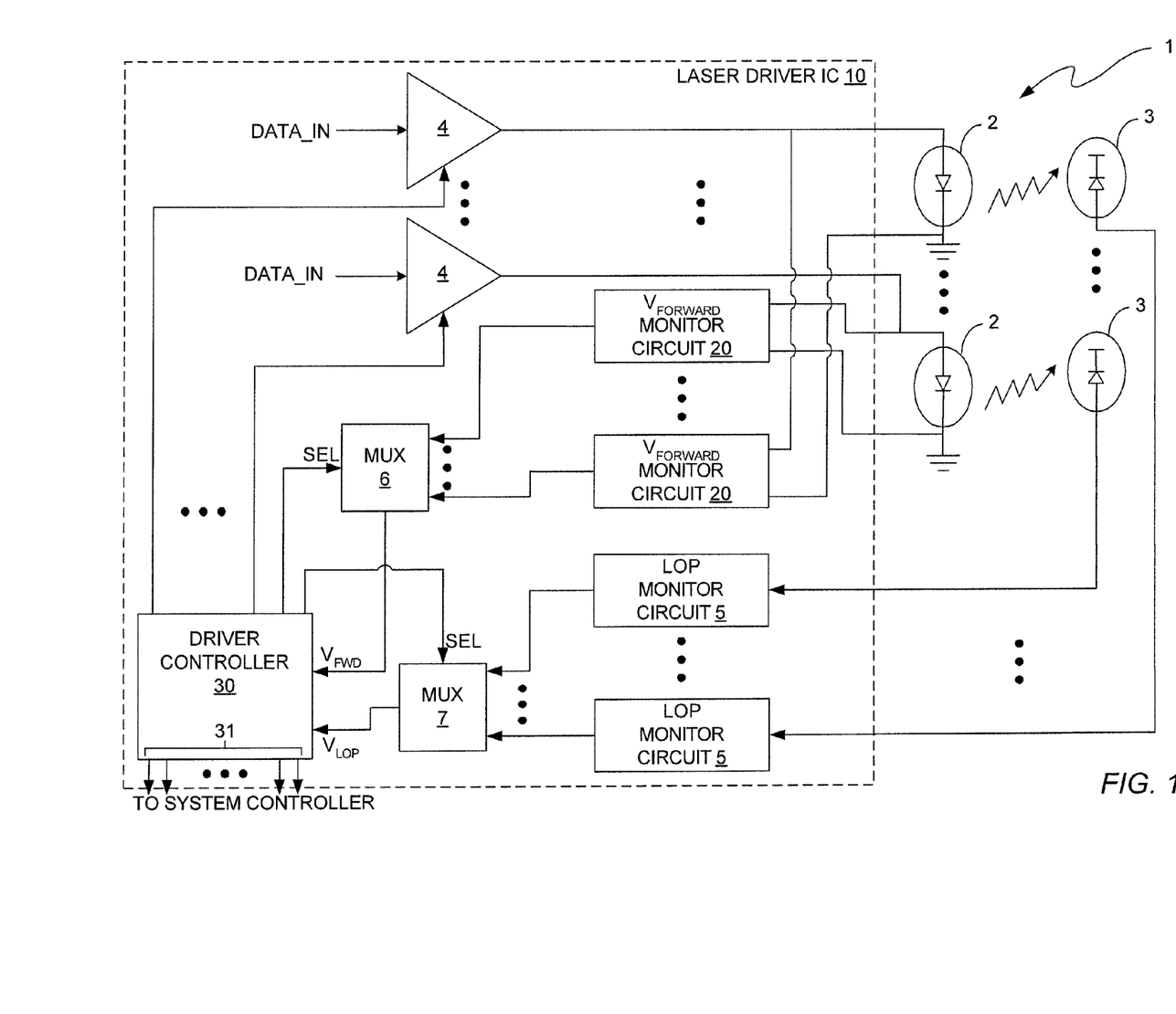
FIG. 1 illustrates a block diagram of an optical transmitter in accordance with a first illustrative embodiment of the invention.

FIG. 1 illustrates a block diagram of an optical transmitter 1 in accordance with a first illustrative embodiment of the invention. The optical transmitter 1 may be part of a transmitter module that has only transmit capability or it may be part of a transceiver module that has both transmit and receive capability. The optical transmitter 1 shown in FIG. 1 has multiple transmit channels. It should be understood, however, that the optical transmitter of the invention may have one or more transmit channels. The optical transmitter 1 shown in FIG. 1 has multiple laser diodes 2, which may be integrated into a single IC or into multiple respective ICs. The transmitter 1 includes multiple monitor photodiodes 3 for monitoring the respective LOP levels of the respective laser diodes 2. However, the monitor photodiodes 3 are not always present in optical transmitters and therefore are optional.

The optical transmitter 1 includes a laser diode driver IC 10 that controls the operations of the optical transmitter 1. The laser diode driver IC 10 has multiple laser diode driver circuits 4 that receive electrical data signals and generate respective electrical output signals that drive the respective laser diodes 2. The laser diodes 2 generate optical data signals that are optically coupled by an optics system (not shown) into the ends of respective transmit optical fibers (not shown). The monitor photodiodes 3, if present, detect the respective LOP levels of the respective laser diodes 2 and produce respective electrical signals based on the respective detected LOP levels of the respective laser diodes 2. If the monitor photodiodes 3 are present, the electrical signals produced by the monitor photodiodes 3 are fed back to respective LOP monitoring circuits 5, which detect the average LOP levels and produce respective LOP monitor signals indicative of the detected average LOP level, which are then input to a driver controller 30 of the laser diode driver IC 10. The driver controller 30 is typically a state machine comprising a combination of logic gates configured to process these LOP monitor signals in a known manner to produce control signals that are output to the driver circuits 4 to cause the driver circuits 4 to adjust their bias and/or modulation currents to maintain the average LOP levels of the laser diodes 2 at a particular preselected level.

A multiplexer (MUX) 7 may be used to enable the driver controller 30 to select which of the LOP monitor signals is input to and processed by the controller 30 at any given instant in time. The MUX 7 may be eliminated if the driver controller 30 has a sufficient number of input pads and logic gates to simultaneously receive and process all of the LOP monitor signals. In addition, it is not necessary to use a separate LOP monitoring circuit 5 for each of the laser diodes 2. Rather, one or more LOP monitoring circuits 5 may be used for this purpose. For example, a MUX (not shown) may be used to time division multiplex the electrical signals produced by the monitor photodiodes 3 so that a single LOP monitoring circuit 5 receives these electrical signals at different times and thus detects the average LOP levels of each of the laser diodes 2 at different times. In the latter case, the MUX 7 is not needed and only a single LOP monitoring circuit 5 is needed for detecting the average LOP levels of multiple laser diodes 2. Of course, if the transmitter 1 has only a single laser diode 2, the laser diode driver IC 10 would only need a single LOP monitoring circuit 5, in which case the MUX 7 would not be included in the IC 10. As indicated above, the monitor photodiodes 3 and the LOP monitoring circuits 5 are optional.

The laser diode driver IC 10 includes at least one forward voltage monitoring circuit 20 for monitoring the forward voltage level, $V_{FWD}$, of at least one of the laser diodes 2. Each of the $V_{FWD}$ monitoring circuits 20 has first and second input terminals that are connected by respective electrical conductors to respective output pads (not shown) of the IC 10, which, in turn, are connected by respective electrical conductors (e.g., wire bonds) to the anode and to the cathode, respectively, of the respective laser diodes 2. The cathodes of the laser diodes 2 are connected to a common or ground node that is at a common or zero potential voltage level. Each of the $V_{FWD}$ monitoring circuits 20 on the IC 10 measures the forward voltage between the anode and cathode of the respective laser diode 2 and produces a corresponding $V_{FWD}$ monitor signal, which is output from the $V_{FWD}$ monitoring circuit 20 and input to the driver controller 30. In accordance with the embodiment shown in FIG. 1, multiple respective $V_{FWD}$ monitoring circuits 20 are implemented for monitoring the respective $V_{FWD}$ levels of the respective laser diodes 2. A MUX 6 may be used to enable the driver controller 30 to select which of the $V_{FWD}$ monitor signals is input to and processed by the driver controller 30 at any given time.

The MUX 6 may be eliminated if the driver controller 30 has a sufficient number of input pads (not shown) and logic (not shown) for simultaneously receiving and processing all of the $V_{FWD}$ monitor signals. In addition, it is not necessary to use a separate $V_{FWD}$ monitoring circuit 20 for each of the laser diodes 2. Rather, one or more $V_{FWD}$ monitoring circuits 20 may be used for this purpose. For example, a MUX (not shown) may be used to time division multiplex the electrical signals representing the respective $V_{FWD}$ levels so that a single $V_{FWD}$ monitoring circuit 20 receives these electrical signals at different times and thus generates the respective $V_{FWD}$ monitor signals at different respective times. In the latter case, the MUX 6 is not needed and only a single $V_{FWD}$ monitoring circuit 20 is needed. Of course, if the transmitter 1 has only a single laser diode 2, the laser diode driver IC 10 only needs a single $V_{FWD}$ monitoring circuit 20, in which case the MUX 6 also is not needed. As will be described below in detail with reference to FIG. 3, the laser diode driver IC 10 typically also includes conditioning circuitry and an analog-to-digital converter (ADC) for processing the $V_{FWD}$ monitor signals prior to them being input to the driver controller 30.

The driver controller 30 typically includes one or more additional input/output (I/O) pads 31 that are electrically connected (e.g., wire bonded) to a system controller (not shown), which is typically also an IC. The driver controller 30 or the system controller (not shown) may further process the $V_{FWD}$ monitor signals to make some determination regarding the health (e.g., the life expectancy) of the laser diodes 2. For example, if the $V_{FWD}$ level of one of the laser diodes 2 begins to change while the bias voltage for that laser diode 2 is maintained at a fixed level by the driver controller 30, this is an indication that the laser diode 2 is likely to fail relatively soon. The driver controller 30 and/or the system controller (not shown) may be configured to perform one or more algorithms that determine whether the $V_{FWD}$ level has changed by a predetermined amount while holding the bias voltage level at a fixed level. If so, the driver controller 30 or the system controller (not shown) may cause a signal to be output to a user that indicates that the corresponding laser diode 2 is likely to fail soon. The algorithm or algorithms may also process the LOP monitor signals in combination with the $V_{FWD}$ monitor signals to make such a determination. Alternatively, the $V_{FWD}$ monitor signals may simply be exported off of the laser diode driver IC 10 to enable this information to be available for use by some other device that is external to the transmitter 1, e.g., an external microprocessor (not shown). The invention is not limited with respect to the manner in which the $V_{FWD}$ monitor signals are processed or used, or with respect to the device that processes the $V_{FWD}$ monitor signals.

Figure 2:
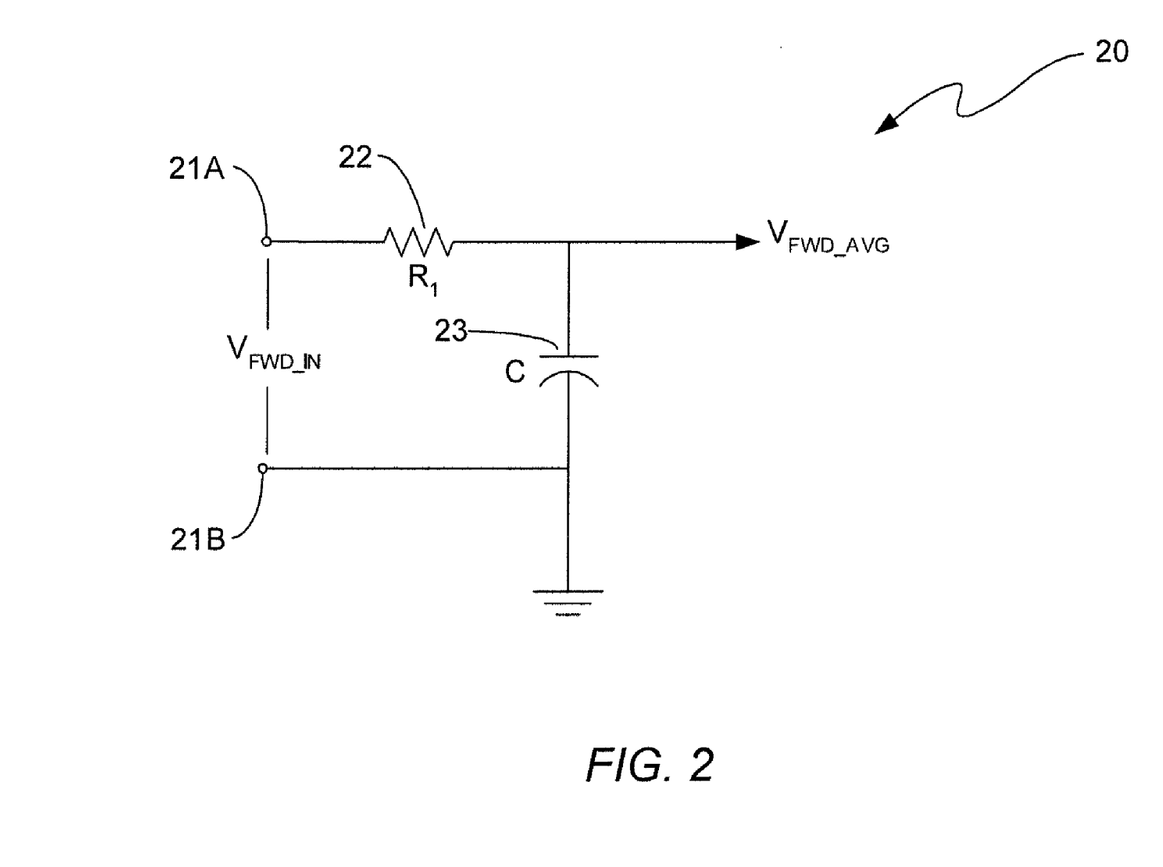
FIG. 2 illustrates a schematic diagram of one of the $V_{FWD}$ monitoring circuits shown in FIG. 1 in accordance with an illustrative embodiment.

FIG. 2 illustrates a schematic diagram of one of the $V_{FWD}$ monitoring circuits 20 shown in FIG. 1 in accordance with an illustrative embodiment. As indicated above with reference to FIG. 1, the $V_{FWD}$ monitoring circuit 20 has first and second input terminals 21A and 21B, respectively, which are electrically connected to respective output pads of the laser diode driver IC 10. These output pads of the laser diode driver IC 10 are, in turn, electrically connected to the anode and cathode, respectively, of one of the laser diodes 2. The cathodes of the laser diodes 2 are connected to a common or ground node. A first resistor, $R_1$, and a capacitor, C, of the circuit 20 form a low pass filter that low pass filters (i.e., averages) the input forward voltage signal, $V_{FWD\_IN}$, to obtain a $V_{FWD\_AVG}$ signal. The $V_{FWD\_AVG}$ signal is the output of the $V_{FWD}$ monitoring circuit 20.

Figure 3:
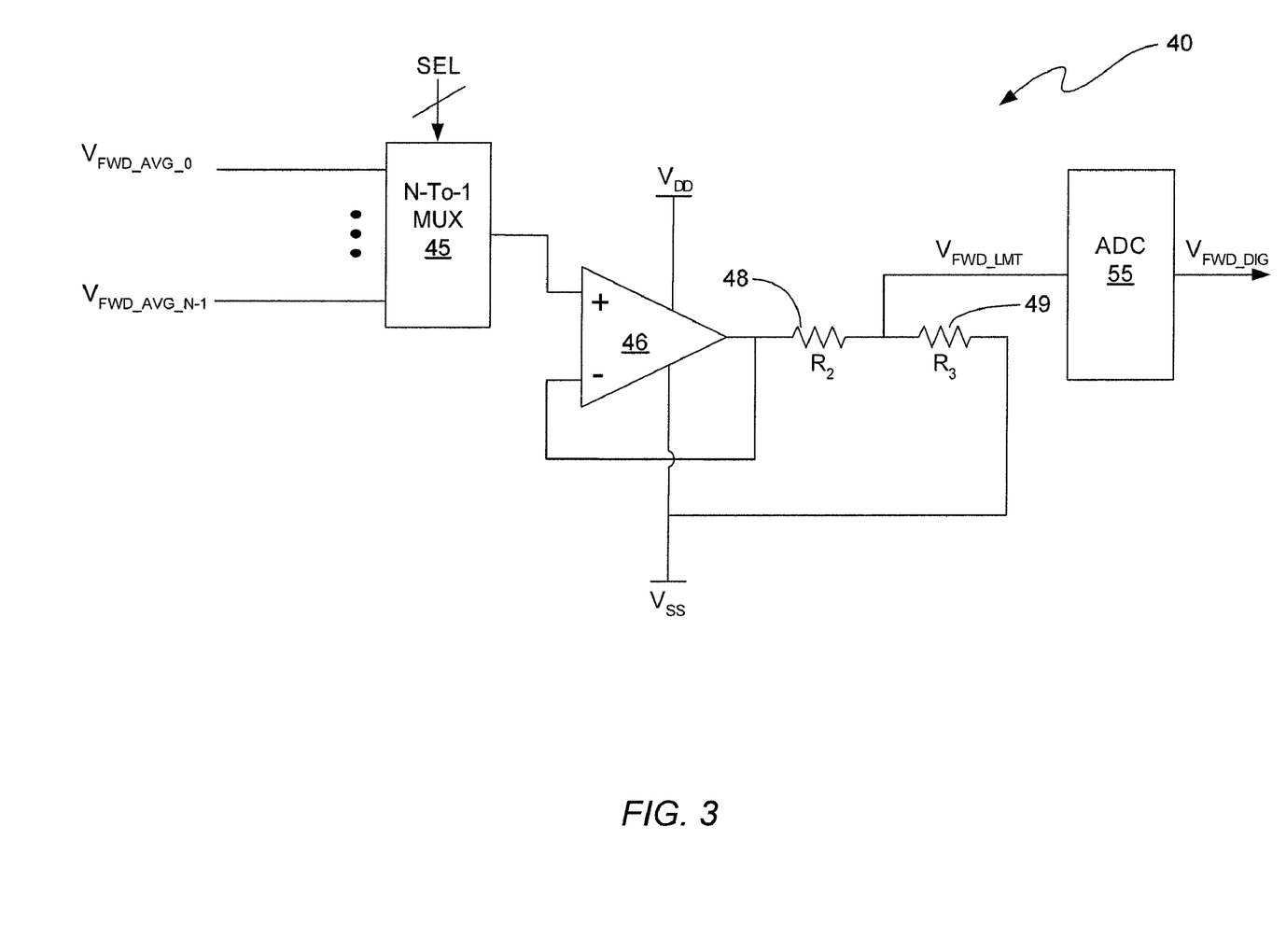
FIG. 3 illustrates a block diagram of a conditioning circuit that receives the $V_{FWD\_AVG}$ signal output from the $V_{FWD}$ monitoring circuit shown in FIG. 2 and conditions the signal to make it suitable for processing by an ADC.

FIG. 3 illustrates a block diagram of a conditioning circuit 40 that receives the $V_{FWD\_AVG}$ signal output from the $V_{FWD}$ monitoring circuit 20 and conditions the signal to make it suitable for processing by an ADC 55. In order to enable the conditioning circuit 40 to be used to condition multiple $V_{FWD\_AVG}$ signals output from the multiple respective $V_{FWD}$ monitoring circuits 20, a MUX 45 is used to select one of N $V_{FWD\_AVG}$ signals, $V_{FWD\_AVG\_0}$ through $V_{FWD\_AVG\_N-1}$, where N is a positive integer that is equal to or greater than 1. For example, if twelve laser diodes 2 are used, then N=12. The selected $V_{FWD\_AVG}$ signal is then applied to the non-inverting input of an operational amplifier (Op Amp) 46, which also receives supply voltages, $V_{DD}$ and $V_{SS}$. The Op Amp 46 essentially acts as a voltage follower circuit that buffers the $V_{FWD\_AVG}$ signal and provides it with a gain of one. The output of the Op Amp 46 is fed back to the inverting input of the Op Amp 46. The output of the Op Amp 46 is also connected to a voltage divider circuit made up of second and third resistors, $R_2$ and $R_3$, which are labeled with reference numerals 48 and 49, respectively. The value of $R_3$ is typically equal to $2R_2$. The voltage divider made up of resistors 48 and 49 limits the amplitude of the voltage signal output from the Op Amp 46 so that it is at a level that is suitable for processing by the ADC 55. The ADC 55 outputs a digitized version of $V_{FWD\_AVG}$, referred to herein as $V_{FWD\_DIG}$. The conditioning circuit 40 is typically located on the laser diode driver IC 10 (FIG. 1) and is external to or internal to the laser diode driver IC 10 (FIG. 1). Any part or all of the conditioning circuit 40 may be external to the laser diode driver IC 10.

The selector signal, SEL, to the MUX 45 is typically provided to the MUX 45 via a multi-bit line in order to provide a multi-bit selection signal that ranges from a value of 0 to a value of $2^{N-1}$. In this way, the analog signals that are output from multiple $V_{FWD}$ monitoring circuits 20 may be converted into digital signals during different time periods using a single ADC 55. This arrangement also allows the same set of input pads on the controller 30 (FIG. 1) to be used to receive the respective $V_{FWD\_DIG}$ signals corresponding to the respective $V_{FWD}$ monitoring circuits 20 at different respective time instants. As indicated above, however, it is not necessary for the $V_{FWD\_AVG}$ signals that are output from the $V_{FWD}$ monitoring circuits 20 to be input to the controller 30. Rather, the $V_{FWD\_AVG}$ signals may simply be exported off of the laser diode driver IC 10 when the corresponding selection signal is provided to MUX 45. The MUX 45 is optional, but preferred. The SEL signal that is provided to the MUX 45 may be generated on the laser diode driver IC 10 or it may be generated external to the IC 10. In the latter case, the SEL signal may be sent from a source external to the driver IC 10 that sequentially alters the SEL signal binary number to cause the $V_{FWD\_AVG}$ signals corresponding to different laser diodes 2 of the same or of different transmitters 1 to be sequentially inputted to the controller 30 and/or exported off of the IC 10.

It should be noted that the arrangements shown in FIGS. 1-3 are merely examples of a few of many possible arrangements that are suitable for achieving the goals of the invention. For example, an equivalent $V_{FWD}$ monitor function could also be realized with a circuit where the laser diode driver IC is connected to the cathode of the laser diode and the anode of the laser diode is connected to a positive supply. Persons of ordinary skill in the art will understand, in view of the description being provided herein, that the embodiments described herein may be modified in a variety of ways without deviating from the scope and goals of the invention.

Figure 4:
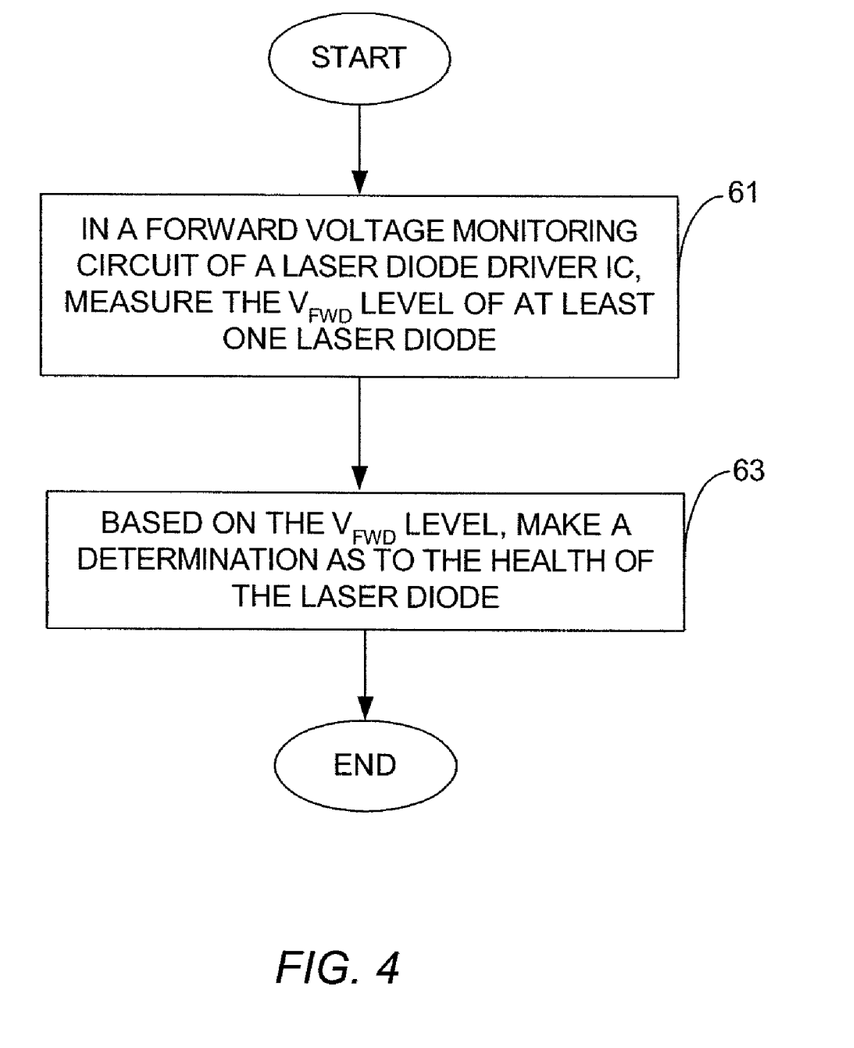
FIG. 4 illustrates a flowchart that represents the method in accordance with an illustrative embodiment of the invention for monitoring the forward voltage level of a laser diode in a laser diode driver IC.

FIG. 4 illustrates a flowchart that represents the method in accordance with an embodiment for monitoring the forward voltage level of a laser diode in a laser diode driver IC. The algorithm represented by the flowchart shown in FIG. 4 may be performed by the controller 30 or by some other processing device that is either on the laser diode driver IC 10 or is external to the laser diode driver IC 10. After the algorithm starts executing, the forward voltage level, $V_{FWD}$, of at least one laser diode 2 is measured, as indicated by block 61. Based on the measured $V_{FWD}$ level, a determination is made as to the health of the laser diode, as indicated by block 63.

Figure 5:
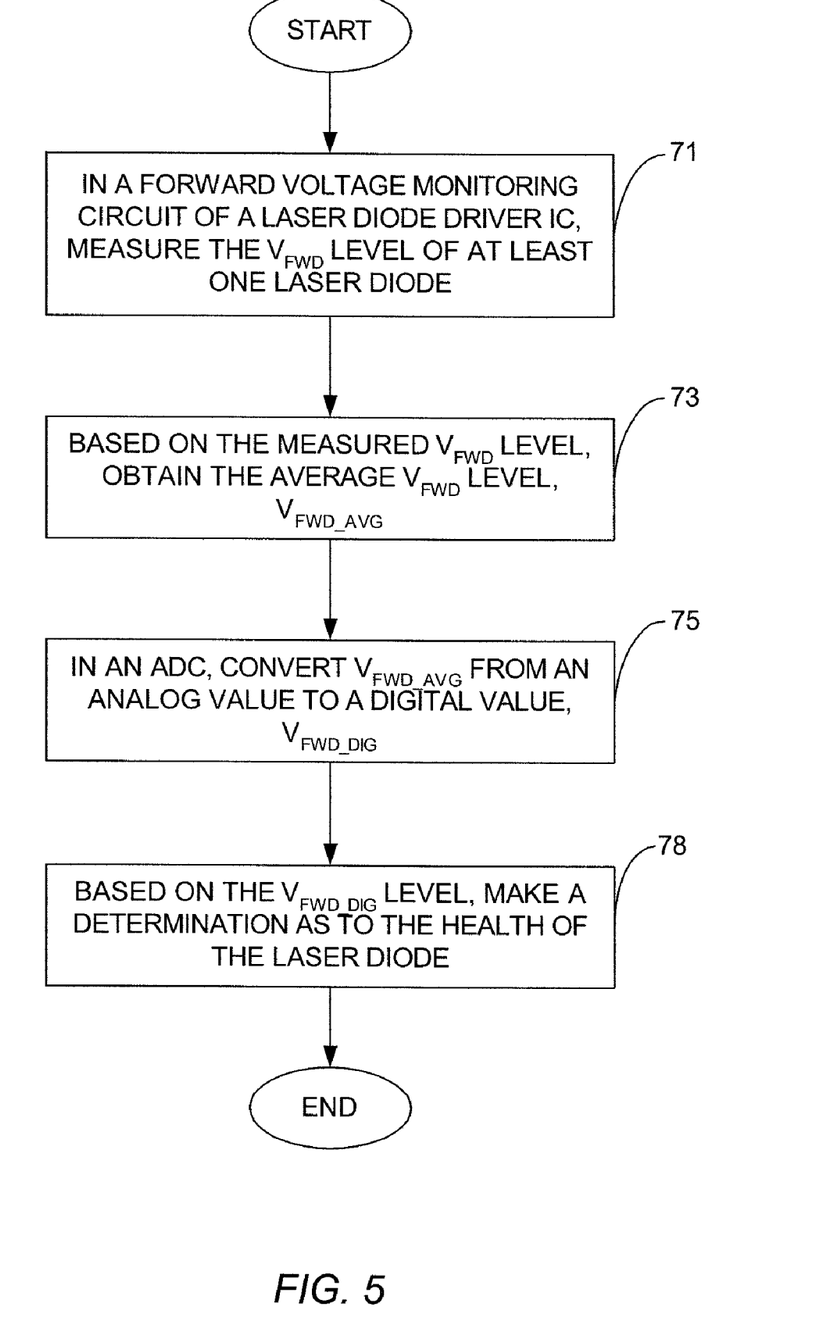
FIG. 5 illustrates a flowchart that represents the method in accordance with another illustrative embodiment for monitoring the forward voltage level of a laser diode in a laser diode driver IC.

Other processes in addition to those shown in FIG. 4 are typically also performed. FIG. 5 illustrates a flowchart that represents the method in accordance with another illustrative embodiment for monitoring the forward voltage level of a laser diode in a laser diode driver IC. After the algorithm starts executing, the forward voltage level, $V_{FWD}$, of at least one laser diode 2 is measured, as indicated by block 71. Based on the measured $V_{FWD}$ level, an average of the $V_{FWD}$ level, $V_{FWD\_AVG}$, is obtained, as indicated by block 73. The $V_{FWD\_AVG}$ level is then converted from an analog value into a digital value, $V_{FWD\_DIG}$, as indicated by block 75. Based on the value of $V_{FWD\_DIG}$, a determination is made as to the health of the laser diode, as indicated by block 78.

As indicated above, the processes represented by the flowcharts shown in FIGS. 4 and 5 may be performed for multiple laser diodes in cases where the invention is implemented in a parallel optical transmitter or transceiver that has multiple parallel transmit channels. Also, the determinations represented by blocks 63 and 78 may be performed by logic on the laser diode driver IC 10 or by logic that is external to the laser diode driver IC 10. The monitoring processes represented by block 61 and 71 preferably are always performed in the laser diode driver IC 10. The averaging and ADC processes represented by blocks 73 and 75, respectively, are typically performed in the laser diode driver IC 10, but may be performed by circuitry that is external to the laser diode driver IC 10, as described above with reference to FIGS. 1-5.

The determinations that are made by the processes represented by blocks 63 and 78 are typically made as follows. With reference again to FIG. 1, the controller 30 sends control signals to the driver circuits 4 to cause them to maintain their bias currents at fixed levels. While the bias currents are held at these fixed levels, a determination is made as to whether the forward voltage levels being monitored by the monitoring circuits 20 have changed. This process may be performed over time to detect a trend of the forward voltages changing over time for a given fixed bias current level. If such a change in the forward voltage is detected, this is an indication that the health of the laser diode 2 has degraded and that the laser diode 2 will likely fail soon.

It should be noted that the invention has been described with reference to a few illustrative embodiments for the purposes of describing the principles and concepts of the invention. It will be understood by persons of ordinary skill in the art, in view of the description provided herein, that the invention is not limited to these illustrative embodiments and that many modifications may be made to these embodiments, all of which are within the scope of the invention.

What is claimed is:

1. An optical transmitter comprising:
   N laser diodes, wherein N is a positive integer that is equal to or greater than 1, each laser diode being configured to receive an electrical drive signal that causes the laser diode to produce an optical signal having a light output power (LOP) level, each laser diode having a cathode and an anode, and wherein a respective forward voltage ($V_{FWD}$) signal passes between the anode and the cathode of each respective laser diode; and
   a laser diode driver integrated circuit (IC) comprising:
      N laser diode driver circuits, each driver circuit generating an electrical drive signal that is output via one or more electrical contact pads of the driver IC to a respective one of the laser diodes to cause the respective laser diode to produce a respective optical signal having a respective LOP level;
      at least one $V_{FWD}$ monitoring circuit configured to acquire and measure the $V_{FWD}$ signal passing between the anode and cathode of at least one of the N laser diodes, wherein first and second input terminals of the at least one $V_{FWD}$ monitoring circuit are electrically connected to the anode and cathode, respectively, of the at least one N laser diodes and the $V_{FWD}$ monitoring circuit outputs a $V_{FWD}$ output signal indicative of the measured $V_{FWD}$ level;
      at least one analog-to-digital converter (ADC), the ADC receiving said $V_{FWD}$ output signal and converting it to a digital $V_{FWD}$ signal; and
      a laser diode driver controller configured to receive said digital $V_{FWD}$ signal and having logic configured to control, based on said digital $V_{FWD}$ signal, the laser diode driver IC.

2. The optical transmitter of claim 1, wherein N is equal to 1.

3. The optical transmitter of claim 1, wherein N is equal to or greater than 2, and wherein the laser diode driver IC comprises N of the $V_{FWD}$ monitoring circuits, each of the N $V_{FWD}$ monitoring circuits being configured to acquire and measure a respective one of the $V_{FWD}$ signals passing between the anode and cathode of a respective one of the N laser diodes, the N respective $V_{FWD}$ monitoring circuits outputting N respective $V_{FWD}$ output signals indicative of the N respective measured $V_{FWD}$ levels.

4. The optical transmitter of claim 1, wherein each $V_{FWD}$ monitoring circuit includes a low pass filter section that averages the acquired $V_{FWD}$ signal to produce an average $V_{FWD}$ signal, the average $V_{FWD}$ signal corresponding to said $V_{FWD}$ output signal.

5. The optical transmitter of claim 3, wherein each of the N $V_{FWD}$ monitoring circuits includes a low pass filter section that averages the N acquired $V_{FWD}$ signals to produce N respective average $V_{FWD}$ signals, the N respective average $V_{FWD}$ signals corresponding to said N respective $V_{FWD}$ output signals.

6. The optical transmitter of claim 5, wherein each of the N respective average $V_{FWD}$ signals is exported off of the laser diode driver IC.

7. The optical transmitter of claim 5, wherein the ADC receives each of the N respective $V_{FWD}$ output signals and converts each of the N respective $V_{FWD}$ output signals into N respective digital $V_{FWD}$ signals.

8. The optical transmitter of claim 5, wherein the laser diode driver IC further comprises:
   at least one N-to-1 multiplexer (MUX) having N inputs and 1 output, the MUX receiving the N respective average $V_{FWD}$ signals at the N respective MUX inputs, the MUX receiving a select (SEL) signal at a SEL input of the MUX, the SEL signal having N different binary values, the MUX selecting one of the N average $V_{FWD}$ signals received at an input of the MUX based on the binary value of the SEL signal, the MUX causing the selected average $V_{FWD}$ signal to be output from the MUX; and
   the analog-to-digital converter (ADC) receives each average $V_{FWD}$ signal output from the MUX and converts each average $V_{FWD}$ signal received in the ADC into a respective digital $V_{FWD}$ signal.

9. The optical transmitter of claim 7, wherein each of the N respective digital $V_{FWD}$ signals is input to the driver controller and processed by the driver controller to determine a life expectancy of each of the N respective laser diode associated with the N respective digital $V_{FWD}$ signals.

10. The optical transmitter of claim 7, wherein each of the respective digital $V_{FWD}$ signals is exported off of the laser diode driver IC.

11. The optical transmitter of claim 8, wherein each of the respective digital $V_{FWD}$ signals is input to the driver controller and processed by the driver controller to determine a respective life expectancy of the respective laser diode associated with the respective digital $V_{FWD}$ signal.

12. The optical transmitter of claim 8, wherein each of the respective digital $V_{FWD}$ signals is exported off of the laser diode driver IC.

13. An optical transmitter comprising:
   N laser diodes, wherein N is a positive integer that is equal to or greater than 1, each laser diode being configured to receive an electrical drive signal that causes the laser diode to produce an optical signal having a light output power (LOP) level, each laser diode having a cathode and an anode, and wherein a respective forward voltage ($V_{FWD}$) signal passes between the anode and the cathode of each respective laser diode; and
   a laser diode driver integrated circuit (IC) comprising:
      N laser diode driver circuits, each driver circuit generating an electrical drive signal that is output via one or more electrical contact pads of the driver IC to a respective one of the laser diodes to cause the respective laser diode to produce a respective optical signal having a respective LOP level;
      N $V_{FWD}$ monitoring circuits configured to acquire respective ones of the $V_{FWD}$ signals passing between the respective anodes and cathodes of the N respective laser diodes, each of the N $V_{FWD}$ monitoring circuits having a low pass filter section that averages the respective acquired $V_{FWD}$ signal to produce a respective average $V_{FWD}$ signal, the N respective average $V_{FWD}$ signals being output from the N respective $V_{FWD}$ monitoring circuits;

a laser diode driver controller having logic configured to control the laser diode driver IC;

at least one N-to-1 multiplexer (MUX) having N inputs and 1 output, the MUX receiving the N respective average $V_{FWD}$ signals at the N respective MUX inputs, the MUX receiving a select (SEL) signal at a SEL input of the MUX, the SEL signal having N different binary values, the MUX selecting one of the N average $V_{FWD}$ signals received at the inputs of the MUX based on the binary value of the SEL signal, the MUX causing the selected average $V_{FWD}$ signal to be output from the MUX; and an analog-to-digital converter (ADC), the ADC receiving each average $V_{FWD}$ signal output from the MUX and converting each average $V_{FWD}$ signal received in the ADC into a respective digital $V_{FWD}$ signal.

14. The optical transmitter of claim 13, wherein each of the respective digital $V_{FWD}$ signals is input to the driver controller and processed by the driver controller to determine a respective life expectancy of the respective laser diode associated with the respective digital $V_{FWD}$ signal.

15. The optical transmitter of claim 13, wherein each of the respective digital $V_{FWD}$ signals is exported off of the laser diode driver IC.

16. A method for monitoring a forward voltage of a laser diode in an optical transmitter, the method comprising:

providing N laser diodes in the transmitter, wherein N is a positive integer that is equal to or greater than 1, each laser diode being configured to receive an electrical drive signal that causes the laser diode to produce an optical signal having a light output power (LOP) level, each laser diode having a cathode and an anode, and wherein a respective forward voltage ($V_{FWD}$) signal passes between the anode and the cathode of each respective laser diode; and providing a laser diode driver integrated circuit (IC) comprising:

N laser diode driver circuits;

at least one $V_{FWD}$ monitoring circuit having first and second input terminals electrically connected to the anode and cathode, respectively, of the at least one N laser diodes;

at least one analog-to-digital converter (ADC); and a laser diode driver controller having logic configured to control the laser diode driver IC;

causing each driver circuit to generate an electrical drive signal that is output via one or more electrical contact pads of the driver IC to a respective one of the laser diodes to cause the respective laser diode to produce a respective optical signal having a respective LOP level;

in said at least one $V_{FWD}$ monitoring circuit, via said first and second input terminals, acquiring and measuring the $V_{FWD}$ signal passing between the anode and cathode of at least one of the N laser diodes;

outputting a $V_{FWD}$ output signal from the $V_{FWD}$ monitoring circuit indicative of the measured $V_{FWD}$ level;

the ADC receiving said output $V_{FWD}$ signal and converting it to a digital $V_{FWD}$ signal.

17. The method of claim 16, wherein N is equal to 1.

18. The method of claim 16, wherein each $V_{FWD}$ monitoring circuit includes a low pass filter section that averages the acquired $V_{FWD}$ signal to produce an average $V_{FWD}$ signal, the average $V_{FWD}$ signal corresponding to said $V_{FWD}$ output signal.

19. The method of claim 16, wherein N is equal to or greater than 2, and wherein the laser diode driver IC comprises N of the $V_{FWD}$ monitoring circuits, each of the N $V_{FWD}$ monitoring circuits being configured to acquire and measure a respective one of the $V_{FWD}$ signals passing between the anode and cathode of a respective one of the N laser diodes, the N respective $V_{FWD}$ monitoring circuits outputting N respective $V_{FWD}$ output signals indicative of the N respective measured $V_{FWD}$ signals.

20. The method of claim 19, wherein each of the N $V_{FWD}$ monitoring circuits includes a low pass filter section that averages the N acquired $V_{FWD}$ signals to produce N respective average $V_{FWD}$ signals, the N respective average $V_{FWD}$ signals corresponding to said N respective $V_{FWD}$ output signals.

21. The method of claim 20, further comprising:

exporting each of the N respective average $V_{FWD}$ signals off of the laser diode driver IC.

22. The method of claim 21, further comprising:

receiving the N respective average $V_{FWD}$ signals in a processing device external to the laser diode driver IC and processing the N respective average $V_{FWD}$ signals in the processing device to determine a life expectancy of each of the N respective laser diodes.

23. The method of claim 20 further comprising:

receiving each of the N respective $V_{FWD}$ output signals in the ADC; and in the ADC, converting each of the N respective $V_{FWD}$ output signals into N respective digital $V_{FWD}$ signals.

24. The method of claim 23, further comprising:

in the controller, processing the N respective digital $V_{FWD}$ signals to determine a life expectancy of each of the N respective laser diodes.

* * * * *